United States Patent
Iwata

(10) Patent No.: US 10,359,931 B2
(45) Date of Patent: Jul. 23, 2019

(54) REMOTE OPERATION APPARATUS, REMOTE OPERATION SYSTEM, AND NON-TRANSITORY COMPUTER READABLE MEDIUM STORING PROGRAM

(71) Applicant: FUJI XEROX CO., LTD., Tokyo (JP)

(72) Inventor: Nobuo Iwata, Kanagawa (JP)

(73) Assignee: FUJI XEROX CO., LTD., Tokyo (JP)

( * ) Notice: Subject to any disclaimer, the term of this patent is extended or adjusted under 35 U.S.C. 154(b) by 0 days.

(21) Appl. No.: 15/790,066

(22) Filed: Oct. 23, 2017

(65) Prior Publication Data

US 2018/0165006 A1 Jun. 14, 2018

(30) Foreign Application Priority Data

Dec. 8, 2016 (JP) ................. 2016-238423

(51) Int. Cl.
| | |
|---|---|
| *G06F 3/041* | (2006.01) |
| *G06F 3/0488* | (2013.01) |
| *G08C 17/00* | (2006.01) |
| *G06F 3/023* | (2006.01) |
| *H03M 11/06* | (2006.01) |
| *G06F 9/451* | (2018.01) |

(52) U.S. Cl.
CPC ........ *G06F 3/04886* (2013.01); *G06F 3/0237* (2013.01); *G06F 3/04883* (2013.01); *G08C 17/00* (2013.01); *G06F 9/452* (2018.02); *G06F 2203/0383* (2013.01); *G08C 2201/30* (2013.01); *H03M 11/06* (2013.01)

(58) Field of Classification Search
None
See application file for complete search history.

(56) References Cited

U.S. PATENT DOCUMENTS

| | | | |
|---|---|---|---|
| 2012/0029902 A1* | 2/2012 | Lu | G06F 3/018 704/2 |
| 2013/0181905 A1 | 7/2013 | Chiang | |
| 2016/0370969 A1* | 12/2016 | Matsui | G06F 3/04812 |

FOREIGN PATENT DOCUMENTS

| | | |
|---|---|---|
| JP | 2003-316490 | 11/2003 |
| JP | 2013-145557 | 7/2013 |
| JP | 2014-137671 | 7/2014 |

* cited by examiner

*Primary Examiner* — Joseph R Haley
(74) *Attorney, Agent, or Firm* — JCIPRNET

(57) ABSTRACT

A remote operation apparatus includes: a display that displays a desktop screen of an apparatus to be remotely operated; and a controller that displays an input field and displays a soft keyboard in a case in which a specific operation is performed on a displayed desktop screen, and enables text input to the input field with the soft keyboard.

7 Claims, 10 Drawing Sheets

REMOTE OPERATION APPARATUS, REMOTE OPERATION SYSTEM, AND NON-TRANSITORY COMPUTER READABLE MEDIUM STORING PROGRAM

CROSS-REFERENCE TO RELATED APPLICATIONS

This application is based on and claims priority under 35 USC 119 from Japanese Patent Application No. 2016-238423 filed Dec. 8, 2016.

BACKGROUND

Technical Field

The present invention relates to a remote operation apparatus, a remote operation system, and a non-transitory computer readable medium storing a program.

SUMMARY

According to an aspect of the invention, there is provided a remote operation apparatus including: a display that displays a desktop screen of an apparatus to be remotely operated; and a controller that displays an input field and displays a soft keyboard in a case in which a specific operation is performed on a displayed desktop screen, and enables text input to the input field with the soft keyboard.

BRIEF DESCRIPTION OF THE DRAWINGS

Exemplary embodiment(s) of the present invention will be described in detail based on the following figures, wherein.

DETAILED DESCRIPTION

In the related art, there are known technologies for remotely operating computers using other computers.

Figure 10:
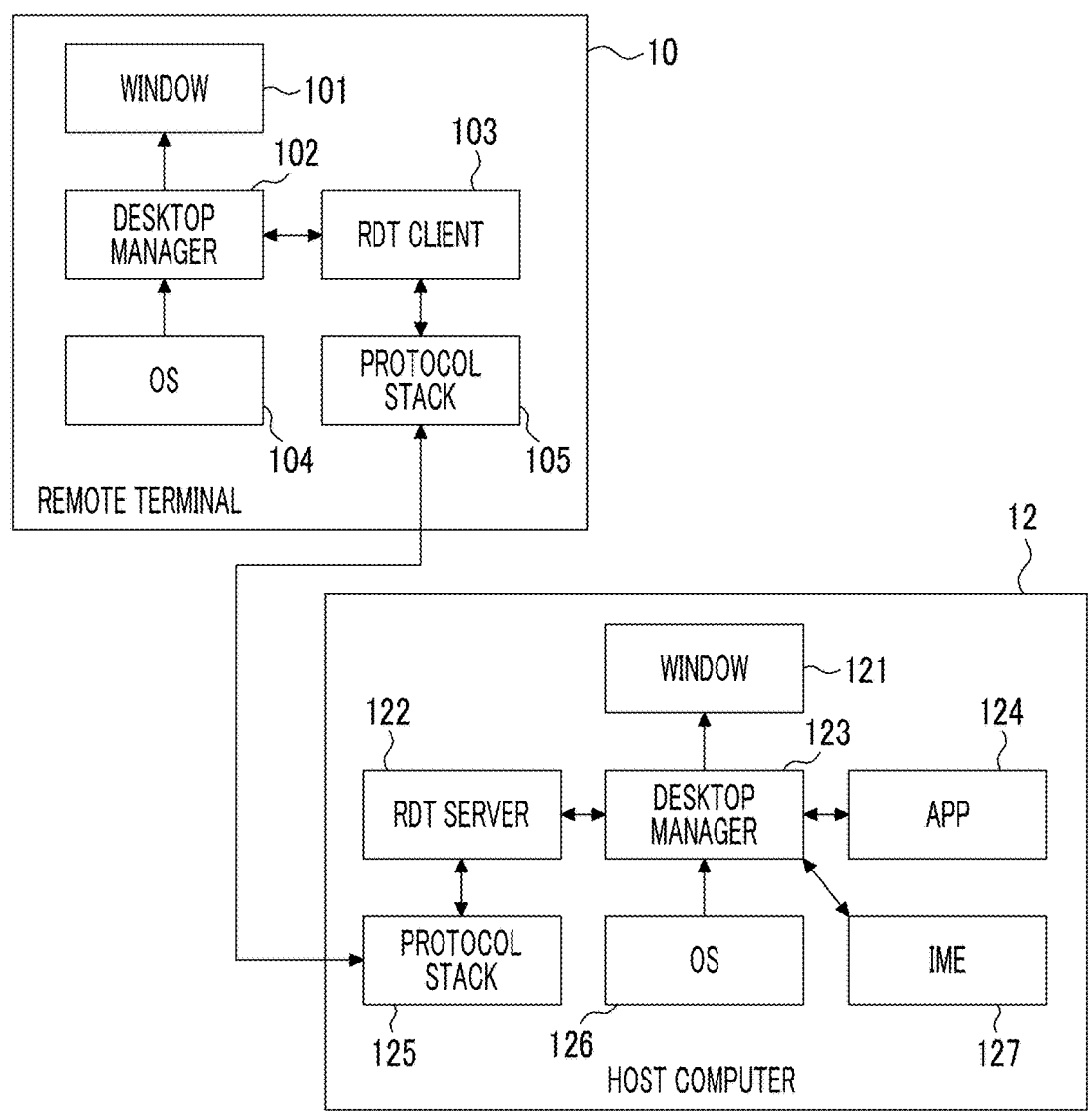
FIG. 10 is a diagram showing basic configurations of a remote terminal and a host computer.

FIG. 10 is a diagram showing a basic configuration of a remote desktop (RDT) of the related art. In this case, a remote terminal 10 and a host computer 12 are connected to each other by a network. Thus, the remote terminal 10 remotely operates the host computer 12.

In a case in which an operating system (OS) 126 of the host computer 12 is activated, a desktop manager 123 is activated. The desktop manager 123 generates a master window 121 and draws a desktop on a display. Various applications (apps) 124 generate slave windows in the master window and transmit drawing commands to the desktop manager 123. The desktop managers 123 draw the slave windows in the window 121.

On the other hand, a remote desktop (RDT) client 103 of the remote terminal 10 is connected to a RDT server 122 of the host computer 12 via protocol stacks 105 and 125 such as TCP/IP. In a case in which the connection is established, the RDT client 103 generates a window 101. The RDT server 122 acquires drawing information in the window 121 via the desktop manager 123 and transmits the drawing information to the RDT client 103 via the protocol stacks 125 and 105.

The RDT client 103 draws a drawing command on the window 101 by transmitting the drawing command to the desktop manager 102 based on the received drawing information. The RDT server 122 monitors a change in the drawing and transmits drawing information regarding a changed portion as a response to an updating request from the RDT client 103 to the RDT client 103. At this time, coordinate information of a cursor is also transmitted to the RDT client 103 as in the drawing information.

An event of a keyboard or a mouse of the remote terminal 10 is transmitted from the OS 104 to the RDT server 122 via the desktop manager 102 and the RDT client 103. A key code of the keyboard is converted into a key symbol independent of a difference in the keyboard to be transmitted.

The RDT server 122 transmits such an event to the desktop manager 123 and the desktop manager 123 notifies the app 124 of the event. The app 124 displays text on the window 121 based on the notified event or changes a cursor position of the window 121.

A display region of the RDT is one object in which a rectangular bitmap image is displayed on the side of the remote terminal 10. An input region of the desktop viewed in the display region on the side of the host computer 12 is a part of the rectangular bitmap image. Accordingly, on the side of the remote terminal 10, the part is not recognized as an input region.

A key event is transmitted from the side of the remote terminal 10 to the side of the host computer 12 and is processed as an event from the keyboard or the mouse connected to the host computer 12 on the side of the host computer 12. The key event is operated on the desktop on the side of the host computer 12 or the window in the desktop and is operated on the desktop or the window in the desktop to be changed. A changed result is transmitted as a bitmap to the side of the remote terminal 10 and is reflected in a desktop region on the side of the remote terminal 10. An application protocol between the RDT client 103 of the remote terminal 10 and the RDT server 122 of the host computer 12 is regulated to a remote frame buffer (RFB) protocol or the like.

In a case in which the remote terminal 10 is a touch panel device, a virtual keyboard or a soft keyboard (hereinafter collectively referred to as a soft keyboard) is displayed on the terminal and a key event input from the soft keyboard can be transmitted as key information to the host computer 12. However, in a case of conversion and input such as a case of input of Japanese, a problem may occur.

Figure 11:
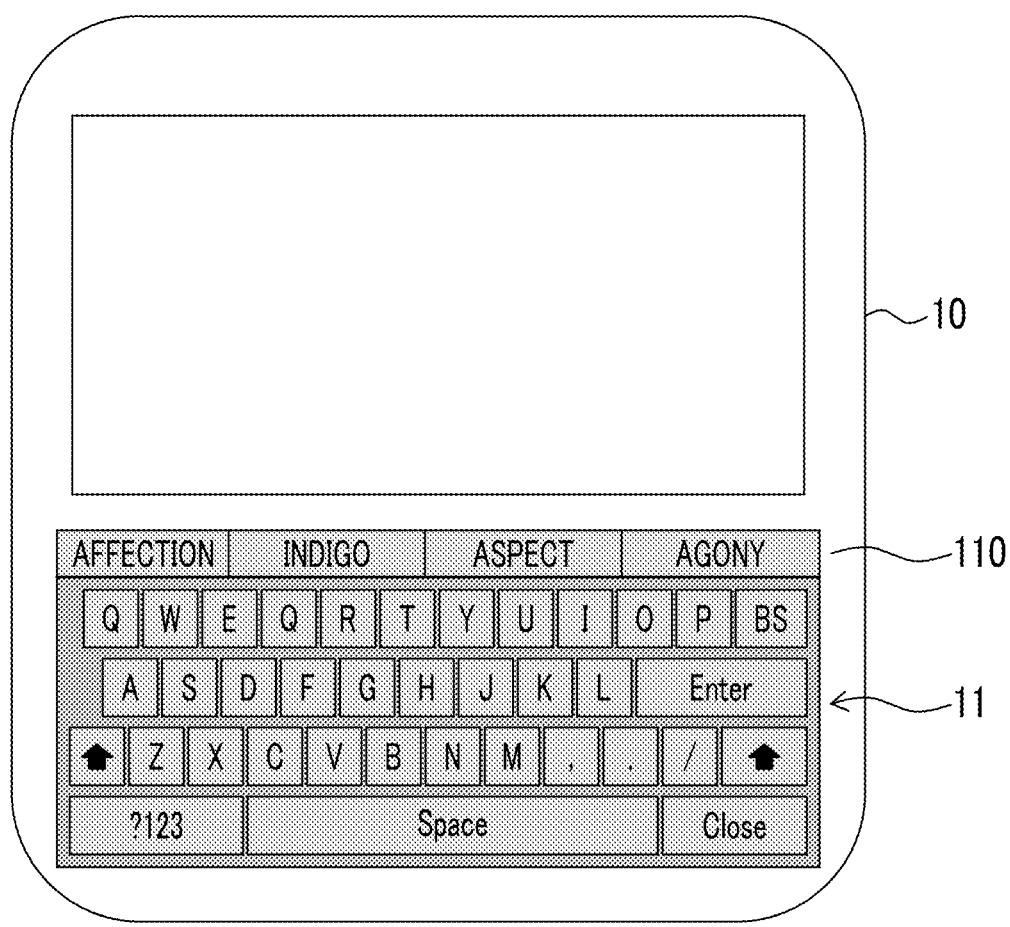
FIG. 11 is a diagram showing a soft keyboard and a display example of conversion candidate selection.

FIG. 11 illustrates a case in which a soft keyboard 11 is displayed on the display terminal 10. In the case of conversion and input such as the case of input of Japanese, the soft keyboard 11 integrated with a conversion candidate selection 110 is used many times. In this case, a text string selected in the conversion candidate selection is not expressed as key input, and thus a fault may occur. For example, in a case in which "a" or "i" is input as Roman character input, "affection" or "indigo" is displayed as a conversion candidate. However, key information is "ai" and this key information is transmitted to the host computer 12. Therefore, there is a problem that "affection" to be originally transmitted is not transmitted.

Hereinafter, exemplary embodiments of the invention will be described with reference to the drawings.

First Exemplary Embodiment

Figure 1:
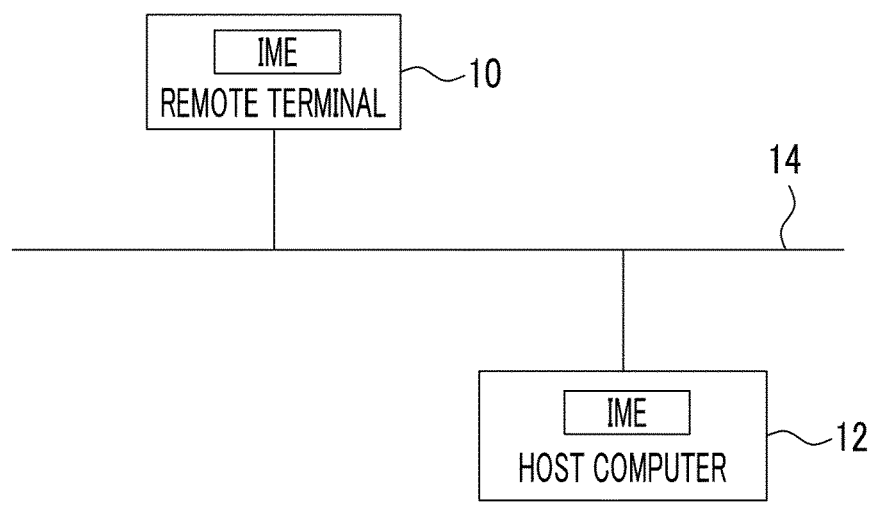
FIG. 1 is a diagram showing a configuration of a system according to an exemplary embodiment.

FIG. 1 is a diagram showing a configuration of a system according to an exemplary embodiment. A remote terminal 10 and a host computer 12 are connected to each other via a network 14. The remote terminal 10 functions as a remote operation apparatus and remotely operates the host computer 12. The remote terminal 10 includes an input method editor (IME) as a text input assistance module and the host computer 12 also includes an IME. The remote terminal 10 is, for example, a touch device such as a tablet terminal or a smartphone including a touch screen.

In the related art, in a case in which the remote terminal 10 and the host computer 12 are connected to be able to transmit and receive data via the network 14 and the remote terminal 10 remotely operates the host computer 12, the IME of the host computer 12 is used. In the exemplary embodiment, however, the IME 106 is used along with the soft keyboard of the remote terminal 10 instead of the IME of the host computer 12.

Figure 2:
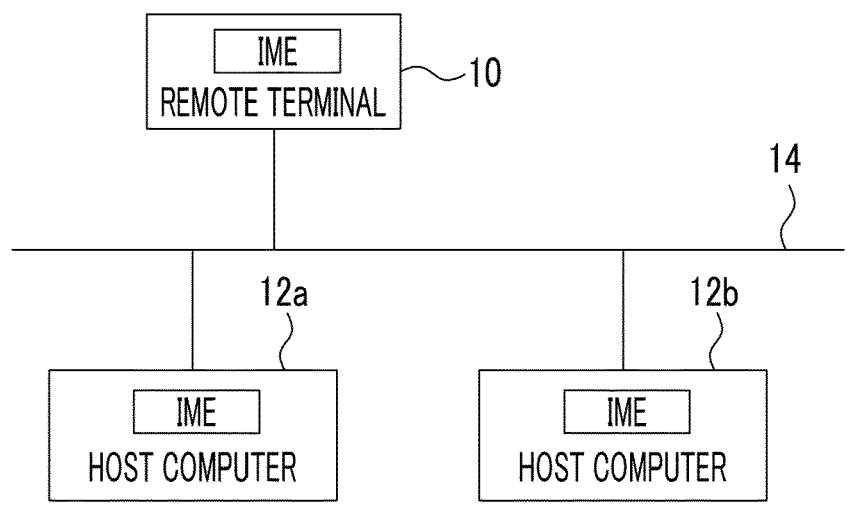
FIG. 2 is a diagram showing another configuration of the system according to the exemplary embodiment.

FIG. 2 is a diagram showing another configuration of the system according to the exemplary embodiment. The remote terminal 10 is connected to plural host computers 12a and 12b via the network 14 and remotely operates the plural host computers 12a and 12b. Even in this case, the IME 106 of the remote terminal 10 is used rather than the IMEs of the host computers 12a and 12b. Since a key symbol input from a soft keyboard of the remote terminal 10 is processed and converted by the IME 106 of the remote terminal 10, and then is transmitted to the host computers 12a and 12b, a conversion result or a learning result is accumulated in the remote terminal 10. In a case in which a soft keyboard is not displayed on a touch device, a key event is not generated. Therefore, a key event is not directly transmitted from the remote terminal 10 to the host computer 12. In the exemplary embodiment, an key can be input by displaying an input field on a touch screen (display) using a specific operation on the remote terminal 10 by the user, more specifically, a specific touch operation on a graphical user interface (GUI) object of the desktop screen of the host computer 12 displayed on the remote terminal 10, as a trigger, focusing the input field, and simultaneously displaying a soft keyboard.

Figure 3:
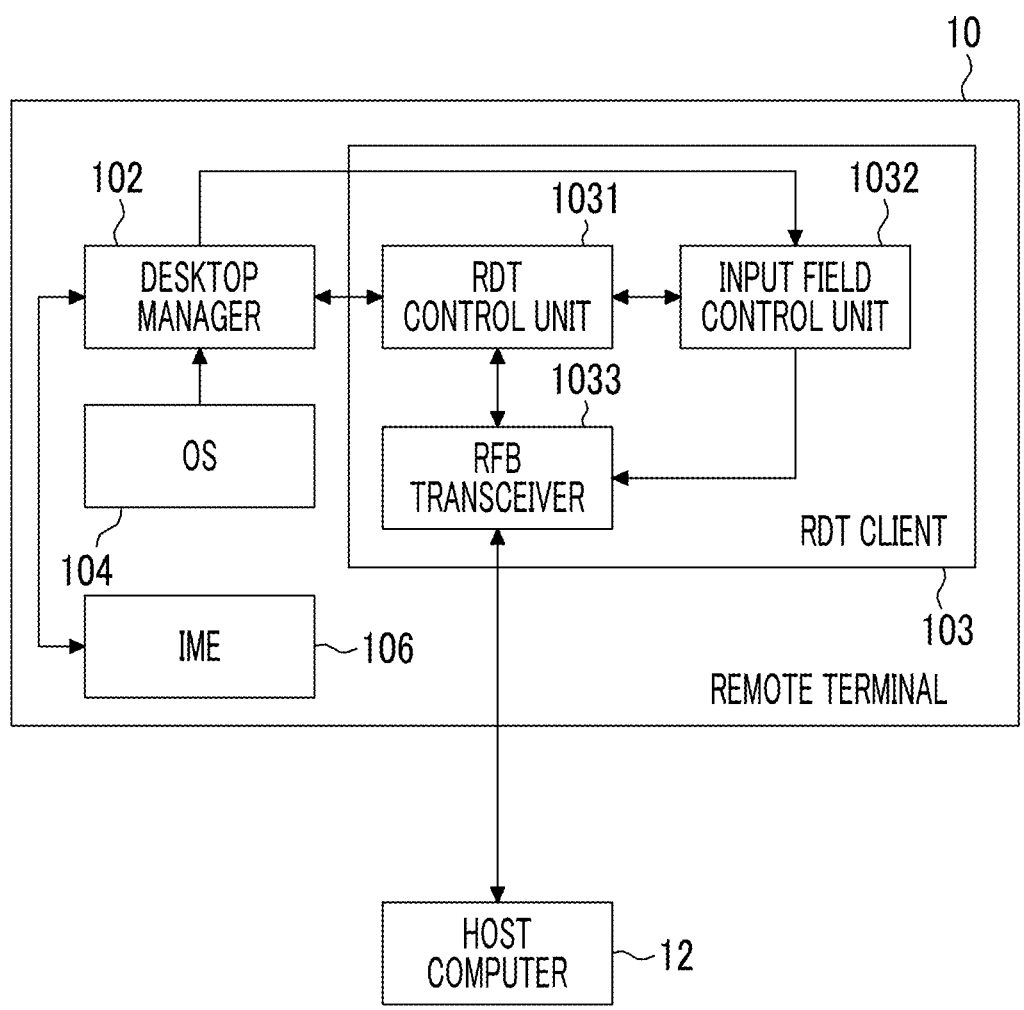
FIG. 3 is a block diagram showing a configuration of a remote terminal.

FIG. 3 is a block diagram showing a configuration of the remote terminal 10 according to the exemplary embodiment. A basic configuration is the same as the configuration of the block diagram shown in FIG. 10. The remote terminal 10 includes a window 101, a desktop manager 102, an RDT client 103, and an OS 104, an IME 106. A hardware configuration of the remote terminal 10 includes a CPU, a ROM, a program memory such as an HDD or an SSD, a working memory such as a RAM, a communication interface, and an input and output interface such as a keyboard, a mouse, or a display as in a general personal computer. The CPU performs various processes by executing processing programs stored in the program memory. The window 101 is display on the display by causing the CPU to execute a processing program. The desktop manager 102, the RDT client 103, and the IME 106 are logic modules realized by causing the CPU to perform processing programs.

The RDT client 103 is connected to an RDT server 122 of the host computer 12 via protocol stack 105 and 125 (see FIG. 10) such as TCP/IP. In a case in which the connection is established, the RDT client 103 generates the window 101 on the display via the desktop manager 102. On the other hand, the RDT server 122 of the host computer 12 acquires drawing information in the window 121 via the desktop manager 123 and transmits the drawing information to the RDT client 103 via the protocol stacks 125 and 105.

The desktop manager 102 functions as a display and draws a desktop screen of the host computer 12 on the window 101 based on the drawing information received from the RDT server 122 of the host computer 12. The desktop screen of the host computer displayed on the display of the remote terminal 10, that is, a display region of a remote desktop, is one object for displaying a rectangular bitmap image on the side of the remote terminal 10 and input region of the desktop on the host computer 12 is a part of the rectangular bitmap image.

The RDT client 103 functions as a controller and includes an RDT control unit 1031, an input field control unit 1032, and an RFB transceiver 1033. The RDT control unit 1031, the input field control unit 1032, and the RFB transceiver 1033 are also logic modules realized by causing the CPU to perform processing programs. Of course, at least some of these units may be configured as hardware circuits.

The RDT control unit 1031 controls an entire operation of the RDT client 103. The input field control unit 1032 controls display and non-display of an input field based on an instruction from the RDT control unit 1031 and performs acquiring or clearing a text string input to the input field. The RFB transceiver 1033 controls transmission and reception of data to and from the RDT server 122 of the host computer 12 based on an RFB protocol. As described above, the RFB protocol is an application protocol between the RDT client 103 and the RDT server 122. Drawing information or event information is converted in conformity to the RFB protocol to be transmitted and received. An overview of the RFB protocol is as follows.

<Remote Terminal 10→Host Computer 12>

FrameBufferEvent: to request transmission of a rectangular bitmap

Coordinates/width and height sizes

KeyEvent: key symbol

Up/down discrimination

PointerEvent: coordinates of mouse

Up/down discrimination types of buttons (left/middle/right)

ClientCutText: to send a text string to a cut buffer of a host.

<Host Computer 12→Remote Terminal 10>

FrameBufferUpdate: to request transmission of a rectangular bitmap

Coordinates/height and width sizes+bitmap data.

The RDT client 103 receives the rectangular bitmap image of the desktop screen of the host computer 12 from the RDT server 122 of the host computer 12 and supplies the rectangular bitmap image to the desktop manager 102. The RDT client 103 receives a key event (a keyboard) or a pointer event (a mouse, a touch, or the like) and transmits the key event or the pointer event to the RDT server 122 of the host computer 12.

In a case in which the RDT control unit 1031 detects a specific operation by the user, for example, a double touch on the desktop screen of the host computer 12, the RDT control unit 1031 instructs the input field control unit 1032 to display and focus the input field. Accordingly, the soft keyboard is displayed and a key input is received.

Hereinafter, a process according to the exemplary embodiment will be described in detail.

Figure 4:
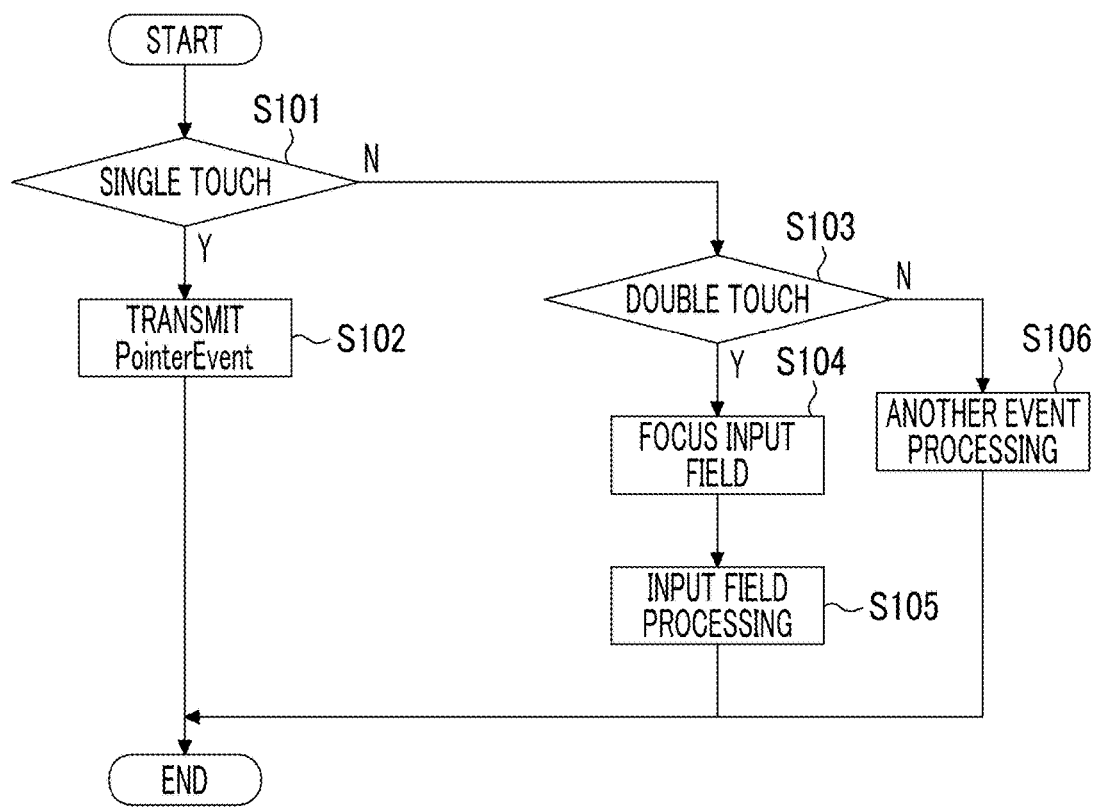
FIG. 4 is a flowchart (part 1) showing a process of the remote terminal according to a first exemplary embodiment.

FIG. 4 is a flowchart showing a process of the RDT control unit 1031 included in the RDT client 103.

First, the RDT control unit 1031 monitors a touch operation by the user and determines whether the touch operation is a single touch on the desktop screen of the host computer 12 (S101). Whether the touch operation is the single touch is determined, for example, by counting the number of touch events in which coordinates approach until a given timeout. In a case in which the number of touch events is only one, the touch operation is determined to be a single touch.

In a case in which the touch operation is the single touch (YES is S101), the RDT control unit 1031 transmits mousedown and mouse-up events to the coordinates related to the single touch (S102). In a case in which a GUI object is at corresponding coordinates on the side of the host computer 12, a mouse event of the GUI object is ignited. For example, in a case in which there is a button object as a GUI object, an operation corresponding to button pressing is generated. In a case in which there is an input field object, an operation of selecting an input filed is generated.

Conversely, in a case in which the touch operation is not the single touch (NO in S101), the RDT control unit 1031 determines whether the touch operation is a double touch (S103). Whether the touch operation is the double touch is determined, for example, by counting the number of touch events in which coordinates approach until a given timeout. In a case in which the number of touch events is two, the touch operation is determined to be a double touch. In a case in which the touch operation is the double touch (YES in S103), the input field control unit 1032 is instructed to display an input field and the input field is focused (S104). Here, the "focus" refers to a state in which a specific input element is selected and an input can be received. The input field may be generated in advance and is in non-display state. The RDT control unit 1031 or the input field control unit 1032 may transition the state from the non-display state to a display state using a double touch as a trigger.

The desktop manager 102 or the OS 104 displays the soft keyboard on a touch screen in association with focus of the input field. In a case in which the soft keyboard is displayed, the IME 106 of the remote terminal 10 is activated. The user inputs desired text to the input field using the displayed soft keyboard and the IME 106. Subsequently, the input field control unit 1032 performs predetermined input field processing (S105). This processing will be further described below. In a case in which the touch operation is neither the single touch nor the double touch (NO is S103), the RDT control unit 1031 processes the touch operation as another event (S106). For example, a process for a window closing button is performed.

Figure 5:
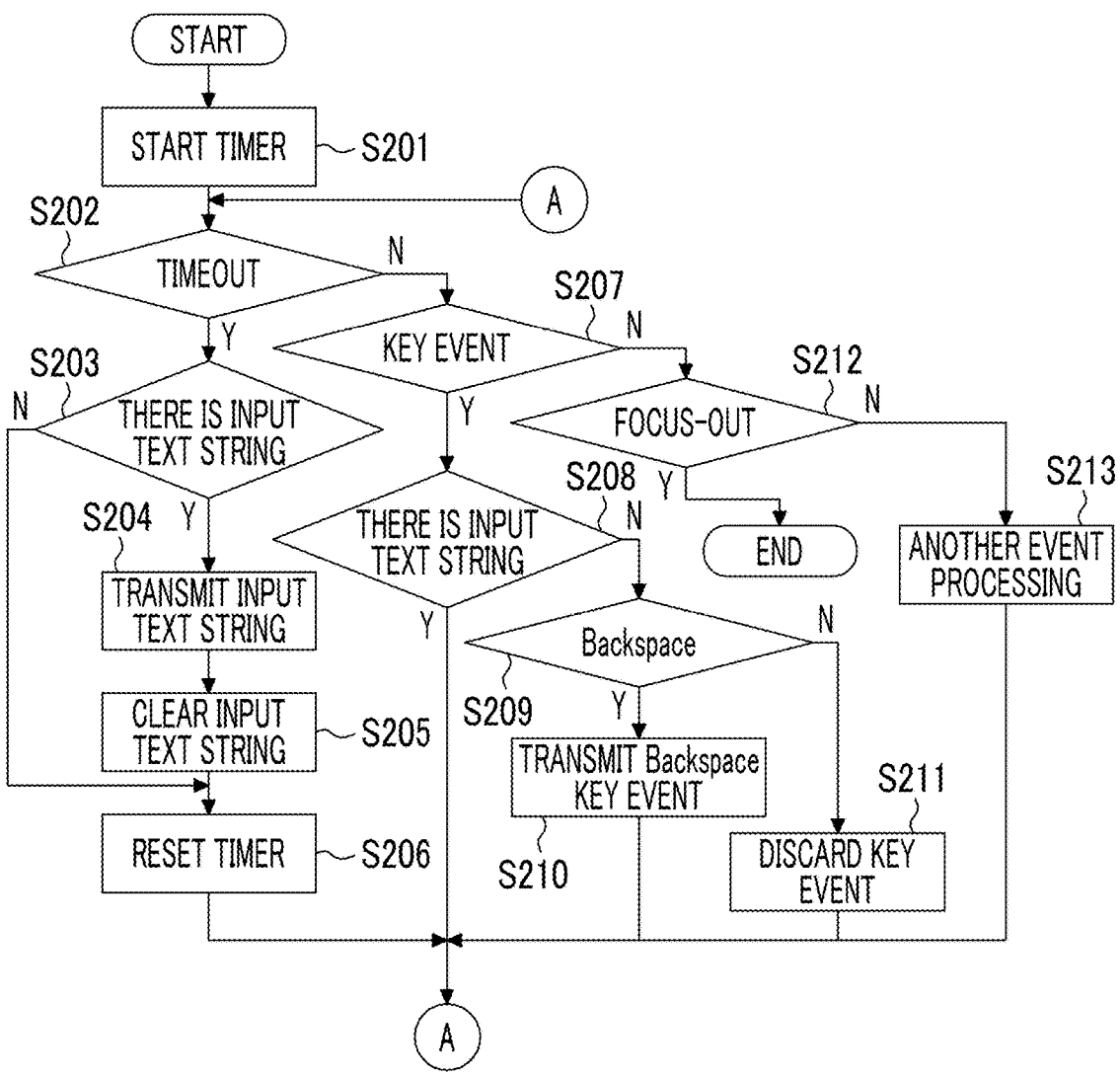
FIG. 5 is a flowchart (part 2) showing the process of the remote terminal according to the first exemplary embodiment.

FIG. 5 is a flowchart showing the details of the process of S105 in FIG. 4, that is, the input field processing.

First, the input field control unit 1032 starts a timer (S201) and determines whether an event is a timeout event (S202). In a case in which the event is the timeout event (YES is S202), it is determined whether there is an input text string in the displayed input field (S203). In a case in which there is the input text string (YES is S203), the text string of the input field is acquired and transmitted to the RDT server 122 of the host computer 12 via the RFB transceiver 1033 (S204). Specifically, the text string is transmitted to a cut buffer of the RDT server 122 and a pointer event pasted to an address of a hot spot is transmitted. Thus, the input text string is pasted to an input field object position on the side of the host computer 12. In a case in which the text string is transmitted, the text string is subjected to code conversion of UTF-8 to be transmitted. Of course, another text code such as UTF-16, UCS-2, or UCS-4 may be used. It may be selected whether a text code determined in advance is used or a text code used by negotiation with the host computer 12 is determined. Subsequently, the input field control unit 1032 clears the acquired input text string (S205) and resets the timer (S206). In a case in which there is no input text string (NO is S203), the timer is reset without performing the processes of S204 and S205 (S206). Thereafter, the processes subsequent to S202 are repeated.

In a case in which the timeout does not occur (NO is S202), the input field control unit 1032 subsequently determines whether the event is a key event (S207). In a case in which the event is the key event (YES in S207), it is determined whether there is an input text string in the input field (S208). In a case in which there is the input text string (YES is S208), the process returns to a process for a subsequent event. In a case in which this process is repeated and the timeout occurs, the processes of S204 to S206 are performed and the input text string is acquired and transmitted to the RDT server 122 of the host computer 12 via the RFB transceiver 1033.

In a case in which there is no input text string (NO in S208), it is subsequently determined whether the event is a backspace key event (S209). In a case in which the event is the backspace key event (YES in S209), the backspace key event is transmitted to the RDT server 122 via the RFB transceiver 1033 (S210). Thus, in a case in which there is the text string input on the side of the host computer 12, one character in the text string is deleted. In a case in which the event is not the backspace key event (NO in S209), the input key event is discarded (S211). Before the key event is discarded, the processes of S204 to S206 may be performed.

In a case in which the event is not the key event either even in the timeout (NO in S207), the input field control unit 1032 further determines whether the event is a focus-out event (S212). The "focus-out" refers to movement of an input reception state from the input field to another region. The focus-out can occur, for example, in a case in which the focus is moved to a display region of the desktop, a case in which the user points a region other than the input field, or a case in which the focus is moved to another input field with a tab key or the like. In a case in which the event is the focus-out event (YES in S212), the input field processing ends. The displayed input field is not displayed and the soft keyboard is not displayed either along with the non-display of the input field. In a case in which the text string remains in the input field, the processes of S204 to S206 may be performed. In a case in which the event is not the focus-out event (NO is S212), another event processing is performed (S213).

Through the forgoing process, the input field is displayed using a double touch as a trigger, the input field is focused, and the soft keyboard is displayed along with the input field. The user can input a desired text string to the input field using the soft keyboard to transmit the text string to the host computer 12. In the host computer 12, a text string is supplied from the RDT server 122 to an app 124 via the desktop manager 123. The app 124 performs a process according to the input text string.

Figure 6:
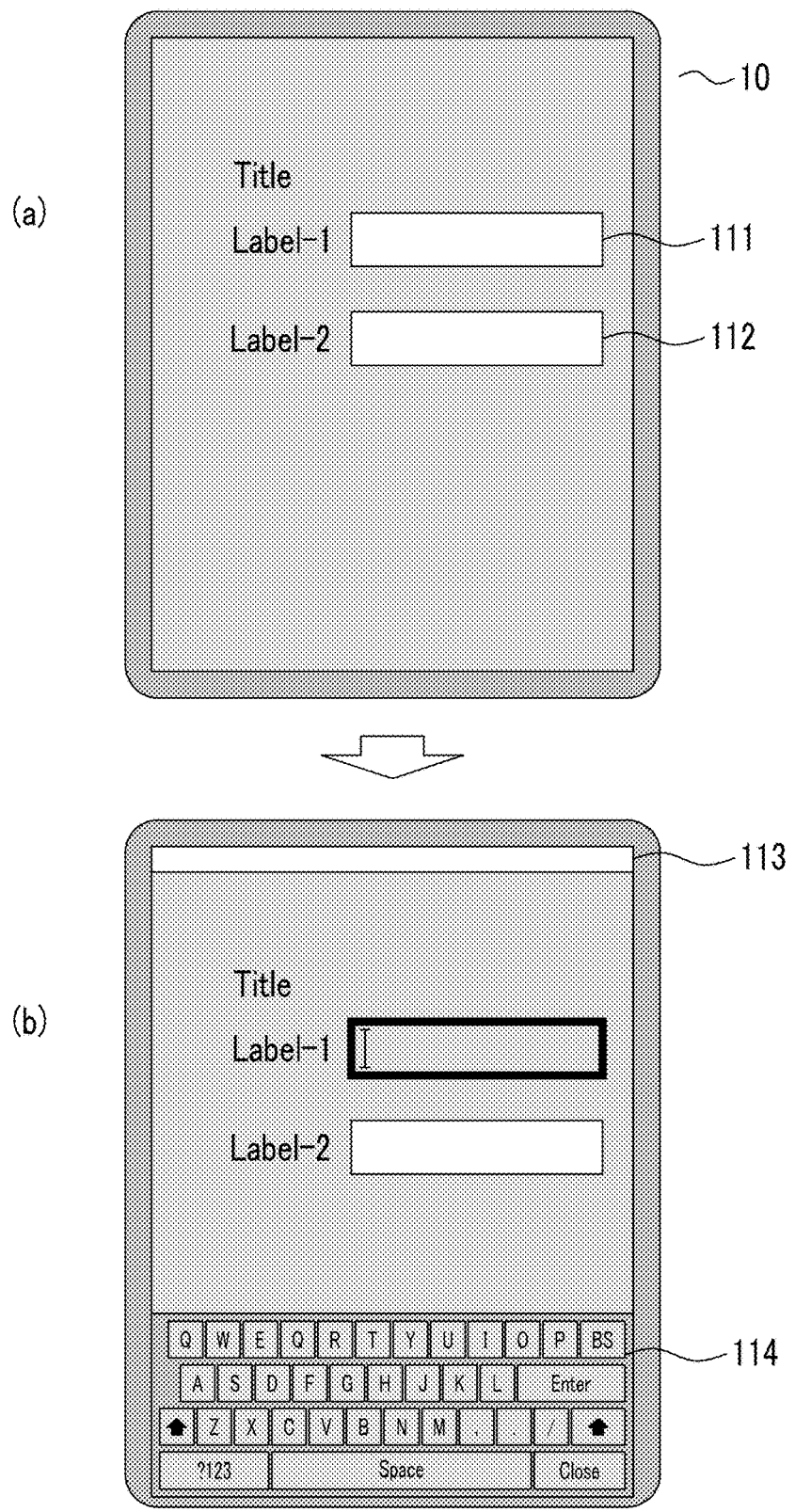
FIG. 6 is a schematic diagram showing a soft keyboard and an input field displayed on the remote terminal.

Parts (a) and (b) in FIG. 6 schematically show display of desktop screen, the input field, and the soft keyboard in the remote terminal 10.

As shown in the part (a) in FIG. 6, the desktop screen of the host computer 12 is displayed on the touch screen (display) of the remote terminal 10.

The user is assumed to operate a double touch on the desktop screen. Then, in the flowchart of the process shown in FIG. 4, the RDT control unit 1031 detects the double touch operation is S103, determines YES, displays the input field 113 and focus the input field 113, and displays the soft keyboard in association with the display of the input field 113.

The part (b) in FIG. 6 shows an example of the displayed input field and soft keyboard. The input field 113 is displayed. A soft keyboard 114 is simultaneously displayed at a predetermined position. The soft keyboard 114 is known and is display as a English input soft keyboard in the drawing. The user input a desired text string to the input field by performing a touch operation on the soft keyboard 114 and transmits the desired text string to the host computer 12.

Next, a case in which a soft keyboard that has a conversion function is displayed will be described.

Second Exemplary Embodiment

Figure 7:
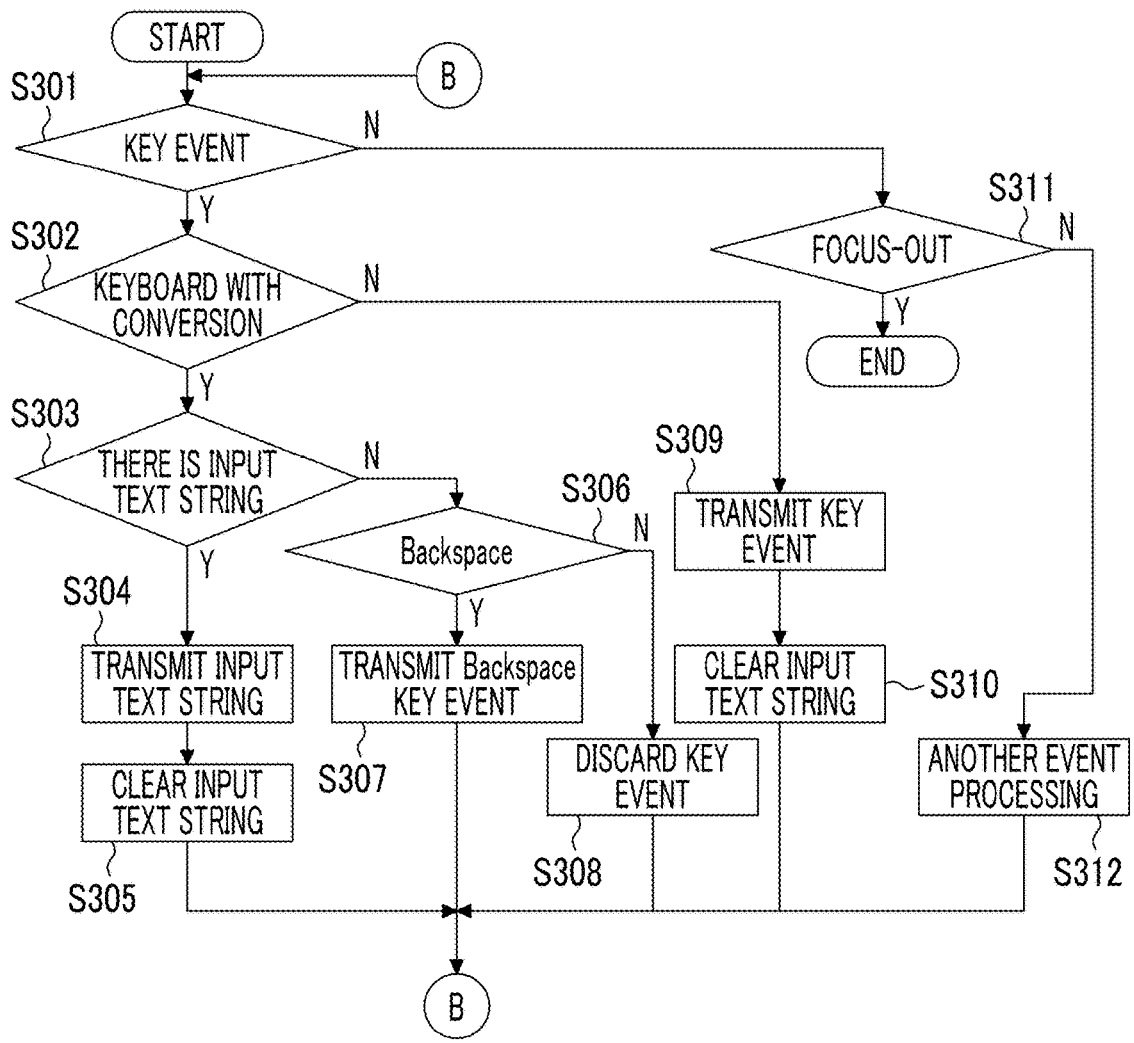
FIG. 7 is a flowchart showing a process of a remote terminal according to a second exemplary embodiment.

FIG. 7 is a flowchart showing another input field processing in the input field control unit 1032. The process is the process of S105 in FIG. 4.

First, the input field control unit 1032 determines whether the event is a key event (S301). In a case in which the event is the key event (YES in S301), it is determined whether the soft keyboard displayed is S104 is a soft keyboard that has a conversion function (S302). An example of the soft keyboard that has the conversion function is a soft keyboard shown in FIG. 11. For example, in a case in which the user inputs "a" and "i", "affection", "indigo", "aspect", and the like are displayed as conversion selection candidates.

In a case in which the keyboard is the soft keyboard that has the conversion function (YES in S302), it is determined whether there is a text string in the input field (S303). In a case in which there is the text string, an input text string (converted text string) is acquired and transmitted to the RDT server 122 (S304). Specifically, the text string is transmitted to a cut buffer of the RDT server 122 and a pointer event pasted to an address of a hot spot is transmitted. The text string is subjected to code conversion of UTF-8 to be transmitted. Then, the input text string is cleared (S305), the processes subsequent to S301 are repeated. In a case in which there is no input text string (NO in S303), it is subsequently determined whether a key is a backspace key (S306). In a case in which the key is the backspace key, a backspace key event is transmitted to the RDT server 122 (S307). Thus, in a case in which there is a text string input on the side of the host computer 12, one character in the text string is deleted. In a case in which the key is not the backspace key (NO in S306), the key event is discarded (S308).

Conversely, in a case in which the keyboard is not the soft keyboard that has the conversion function (S302), it is not necessary to transmit the converted text string. Therefore, the key event is immediately transmitted to the RDT server 122 via the RFB transceiver 1033 (S309). Specifically, a key code is converted into a key symbol to be transmitted to the RDT server 122. Then, the input text string is cleared (S310).

In a case in which the key is not the key event (NO in S301), it is subsequently determined whether the event is a focus-out event (S311). In a case in which the event is the focus-out event (YES is S311), the input field is not displayed and the process ends. Along with the non-display of the input field, the soft keyboard is not displayed either. In a case in which the event is not the focus-out event (NO in S311), another event processing is performed (S312).

In the exemplary embodiment, since the converted text string input to the input field is transmitted to the host computer 12 using the IME 106 in the soft keyboard that has the conversion function, the desired text string can be reliably transmitted to the host computer 12 and remotely operated. Unlike the case of FIG. 11, in a case in which either of the conversion candidates displayed in conversion candidate selection 110 is selected in the exemplary embodiment, the selected text string is input to the input field to be displayed. Then, the text string is acquired and transmitted to the RDT server 122.

In the exemplary embodiment, the type of soft keyboard is determined is S302. However, an activation station of the IME 106 may be determined. In a case in which the IME 106 is activated (connected or validated), YES may be determined in S302 and the input text string may be transmitted. Even in a case in which NO is determined otherwise, the key event may be immediately transmitted.

Next, a case in which a display form of the input field is changed will be described.

Third Exemplary Embodiment

Figure 8:
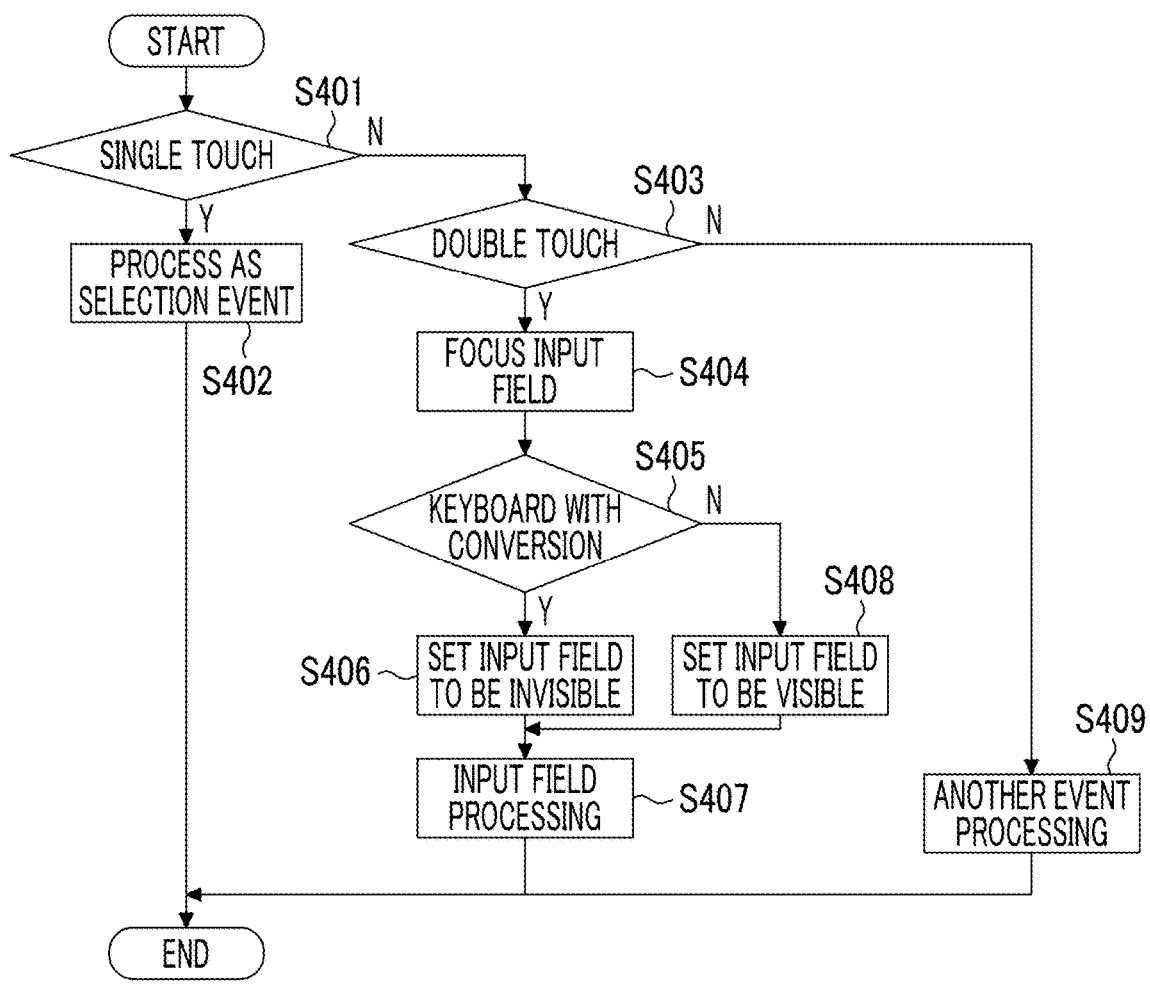
FIG. 8 is a flowchart (part 1) showing a process of a remote terminal according to a third exemplary embodiment.

FIG. 8 is flowchart showing a process of the RDT control unit 1031 included in the RDT client 103.

First, the RDT control unit 1031 determines whether an operation on the desktop screen is a single touch (S401). Whether the operation is the single touch is determined, for example, by counting the number of touch events in which coordinates approach until a given timeout. In a case in which the number of touch events is only one, the operation is determined to be a single touch. In a case in which the number of touch events is twice, the operation is determined to be a double touch. In a case in which the number of touch events is three times, the operation is determined to be a triple touch. In a case in which the operation is the single touch (YES in S401), the RDT control unit 1031 transmits mouse-down and mouse-up events to the coordinates related to the single touch (S402). The same applies to S102 of FIG. 4.

In a case in which the operation is not the single touch (NO in S401), it is subsequently determined whether the operation is a double touch (S403). In a case in which the operation is the double touch (YES in S403), the RDT control unit 1031 focuses the input field (S404). Thus, the soft keyboard is displayed. Subsequently, it is determined whether the displayed soft keyboard has the conversion function (S405). In a case in which the soft keyboard is the soft keyboard that has the conversion function (YES in S405), the input field control unit 1032 is instructed to set the text string input to the input field to a visible state in a visible state (S406). Here, the visible state is a state in which the text string input to the input field is in a readable state. For example, the height of the input field is set to be sufficient high. Then, the input field control unit 1032 performs predetermined input field processing (S407). The input field processing is same as that of the first or second exemplary embodiment.

Conversely, in a case in which the soft keyboard is not the soft keyboard that has the conversion function (NO is S405), the input field is set to an invisible state (S408). For example, the height of the input field is set to be small so that the user may not view the input field. Then, the input field control unit 1032 performs predetermined field processing (S407). The input field processing is the same as that of the first or second exemplary embodiment. In a case in which the touch operation is neither the single touch nor the double touch (NO in S403), another event processing is performed (S409).

In the exemplary embodiment, the type of soft keyboard is determined is S405. However, an activation station of the IME 106 may be determined. In a case in which the IME 106 is activated (connected or validated), the input field may be set to the visible state (S406). In a case in which the IME 106 is not activated (not connected or not validated), the input field may be set to the invisible state (S408).

The visible state and the invisible state in the exemplary embodiment are single forms of a display state of the input field and are different from the non-display state of the input field. In either the visible state or the invisible state, the soft keyboard is displayed by focusing the input field and an input is performed to the input field with the soft keyboard. In the visible state, an input before conversion confirmation is visible. In the invisible state, input keys are sequentially transmitted to a host and input results are transmitted as display of a desktop from the host to a terminal. On the other hand, the non-display state is not focused, and accordingly no input is performed.

The input field in the visible state can be displayed at any position of the window 101. For example, the input field may be displayed to overlap near coordinates at which a double touch is detected, at the position of a GUI object including the coordinates, or at the position of a hot spot.

Fourth Exemplary Embodiment

In the third exemplary embodiment, the example in which the display state of the input field is changed depending on whether there is the conversion function of the soft keyboard has been described. However, the display state of the input field may be changed through an operation by a user.

Figure 9:
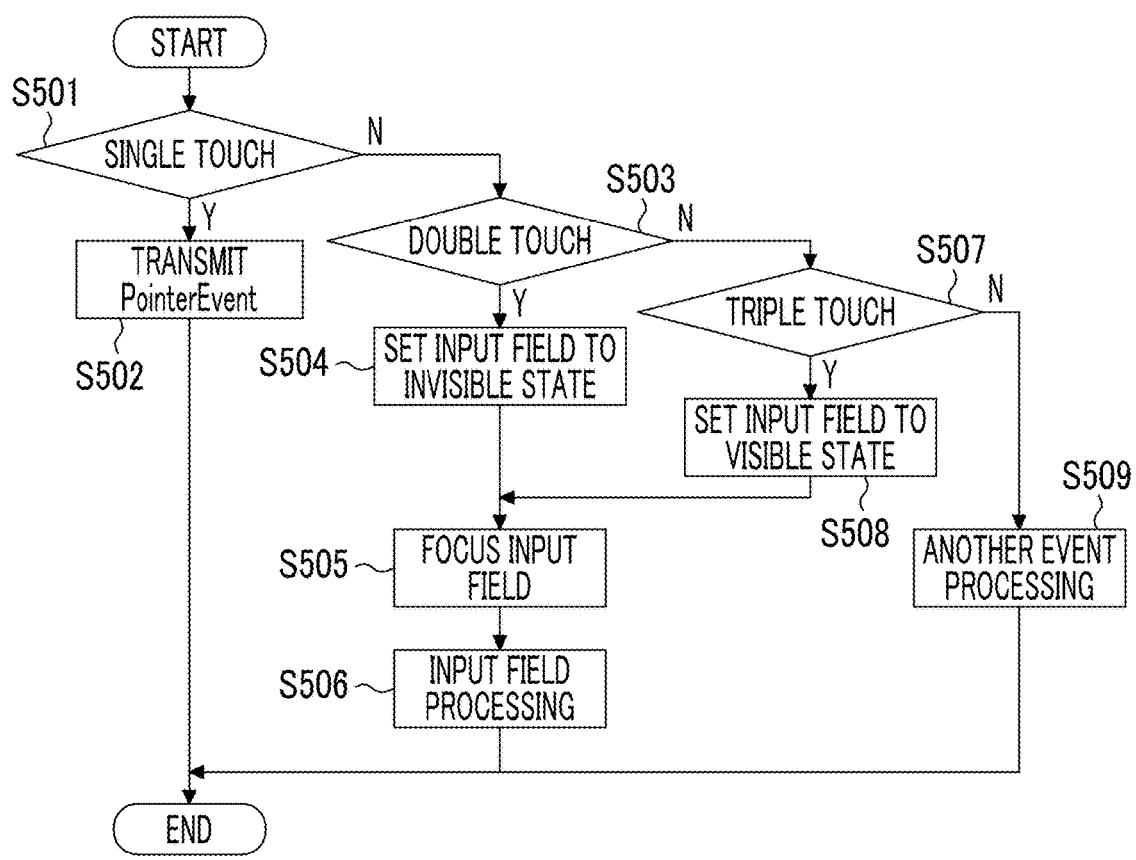
FIG. 9 is a flowchart (part 2) showing a process of a remote terminal according to the third exemplary embodiment.

FIG. 9 is a flowchart showing a process of the RDT control unit 1031 in this case.

First, the RDT control unit 1031 determines whether an operation on the desktop screen is a single touch (S501). Whether the operation is the single touch is determined, for example, by counting the number of touch events in which coordinates approach until a given timeout. In a case in which the number of touch events is only one, the operation is determined to be a single touch. In a case in which the number of touch events is twice, the operation is determined to be a double touch. In a case in which the number of touch events is three times, the operation is determined to be a triple touch. In a case in which the operation is the single touch (YES in S501), the RDT control unit 1031 transmits mouse-down and mouse-up events to the coordinates related to the single touch (S502). The same applies to S102 of FIG. 4.

In a case in which the operation is not the single touch (NO in S501), it is subsequently determined whether the operation is a double touch (S503). In a case in which the touch operation is the double touch (YES in S503), the RDT control unit 1031 instructs the input field control unit 1032 to set the input field to an invisible state (S504) and focuses the input field (S505). Thus, the soft keyboard is displayed. Then, the input field control unit 1032 performs predetermined input field processing (S506).

In a case in which the operation is not the double touch (NO in S503), it is subsequently determined whether the operation is a triple touch (S507). In a case in which the operation is the triple touch (YES in S507), the RDT control unit 1031 instructs the input field control unit 1032 to set the input field to the visible state (S508). Then, the input field is focused (S505), a soft keyboard is displayed along with the focus of the input field, and thus text can be input to the input field. Thereafter, the input field control unit 1032 performs predetermined input field processing (S506). In a case in which the operation is none of the single touch, the double touch, and the triple touch (NO is S507), another event processing is performed (S509).

In this way, in the fourth exemplary embodiment, display/non-display of the input field and the soft keyboard can be changed according to the number of touches on the desktop screen. For example, the user can perform a triple touch on the desktop screen to set the input field to a visible state and input text with a soft keyboard so that the text is transmitted to the host computer 12. The user performs a double touch on the desktop screen to set the input field to the invisible state, display the soft keyboard, and perform an input with the soft keyboard.

The exemplary embodiments of the invention have been described, but the invention is not limited to the exemplary embodiments and various modifications can be made. Hereinafter, modification examples will be described.

Modification Example 1

In the exemplary embodiments, the soft keyboard and the IME 106 are described as separate modules, but the soft keyboard and the IME 106 may be configured as a single module. In a case in which a soft keyboard is displayed, the IME 106 may be simultaneously activated so that text can be input. In this case, in a case in which the soft keyboard is displayed, the RDT control unit 1031 may transmit the fact that the soft keyboard is displayed to the RDT server 122 and the RDT server 122 may invalidate the IME 127 of the host computer 12.

The IME 106 may be activated or stopped according to an IME activation key code and an IME stop key code generated in a case in which the soft keyboard is displayed or the soft keyboard is switched. The IME activation key code can be treated as by an operating system (OS). In a case in which the IME 106 is stationed in the system, the IME 106 may not be activated, but connection to the stationed IME 106 may be performed. The activation of the IME is meant to include the connection of the IME.

Modification Example 2

In the fourth exemplary embodiment, the input field is set to the invisible state by a double touch and the input field is set to the visible state by the triple touch. However, the user may set the visible/invisible state of the input field using another method. For example, the visible/invisible state may be set with a setting dialog displayed on a screen through a specific operation performed in an end of the screen. The visible/invisible state may be set to be fixed to a setting screen of an operating system (OS).

Modification Example 3

In the fourth exemplary embodiment, the input field is set to the invisible state by a double touch and the input field is set to the visible state by the triple touch. Conversely, the input field may be set to the visible state by a double touch and the input field may be set to the invisible state by the triple touch.

Modification Example 4

In the exemplary embodiments, the remote terminal 10 is a touch device such as a tablet terminal or a smartphone. The remote terminal 10 can be applied to a terminal that has no hardware keyboard as well as the touch device. The host computer 12 may be an operation panel of an image forming apparatus such as a multi-function apparatus that has plural functions such as copying and scanning.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A remote operation apparatus comprising:
a display that displays a desktop screen of an apparatus to be remotely operated; and
a controller that displays an input field and displays a soft keyboard in a case in which a specific operation is performed on a displayed desktop screen, and enables text input to the input field with the soft keyboard,
wherein in a case in which the soft keyboard has a conversion function, the controller sets the input field to be in a visible state, and in a case in which the soft keyboard does not have the conversion function, the controller sets the input field to be in an invisible state.

2. The remote operation apparatus according to claim 1, wherein the specific operation on the displayed desktop screen is a touch performed a plurality of times.

3. The remote operation apparatus according to claim 1, wherein in a case in which the soft keyboard has the conversion function, the controller acquires a text string input to the input field and transmits the text string to the apparatus to be remotely operated, and in a case in which the soft keyboard does not have the conversion function, the controller transmits an input key event to the apparatus to be remotely operated.

4. The remote operation apparatus according to claim 2, wherein in a case in which the soft keyboard has the conversion function, the controller acquires a text string input to the input field and transmits the text string to the apparatus to be remotely operated, and in a case in which the soft keyboard does not have the conversion function, the controller transmits an input key event to the apparatus to be remotely operated.

5. The remote operation apparatus according to claim 2, wherein the controller sets display and non-display of the input field according to the number of touches.

6. A remote operation system comprising:
a remote terminal; and
a host computer which is able to be connected to the remote terminal,
wherein the remote terminal includes
a display that displays a desktop screen of the host computer in a case in which the remote terminal is connected to the host computer, and
a controller that displays an input field and displays a soft keyboard in a case in which a specific operation is performed on a displayed desktop screen, and enables text input to the input field with the soft keyboard,
wherein in a case in which the soft keyboard has a conversion function, the controller sets the input field to be in a visible state, and in a case in which the soft keyboard does not have the conversion function, the controller sets the input field to be in an invisible state.

7. A non-transitory computer readable medium storing a program causing a computer to perform:
displaying a desktop screen of an apparatus to be remotely operated; and
displaying an input field and displays a soft keyboard in a case in which a specific operation is performed on a displayed desktop screen, and enabling text input to the input field with the soft keyboard,
wherein in a case in which the soft keyboard has a conversion function, the controller sets the input field to be in a visible state, and in a case in which the soft keyboard does not have the conversion function, the controller sets the input field to be in an invisible state.

* * * * *